United States Patent
Kang

[19]

[11] Patent Number: 6,118,288
[45] Date of Patent: Sep. 12, 2000

[54] ADAPTIVE PCB TESTING SYSTEM EMPLOYING REARRANGABLE TEST PROBES

[76] Inventor: Jeung Gun Kang, #1704 Samwoo Town, 488-18, Songjeong-Dong, Gumi-city, Kyungbuk, Rep. of Korea

[21] Appl. No.: 09/014,287

[22] Filed: Jan. 27, 1998

[30] Foreign Application Priority Data

Jan. 27, 1997 [KR] Rep. of Korea .................... 97-2901

[51] Int. Cl.$^7$ ................................................. G01R 31/02
[52] U.S. Cl. .................................... 324/754; 324/758
[58] Field of Search ........................... 324/754, 755, 324/758, 761, 765

[56] References Cited

U.S. PATENT DOCUMENTS

| | | | |
|---|---|---|---|
| 3,584,300 | 6/1971 | Schulz | 324/761 |
| 4,087,747 | 5/1978 | Deegan et al. | 324/72.5 |
| 4,092,593 | 5/1978 | Wolk | 324/754 |
| 4,443,756 | 4/1984 | Lightbody et al. | 324/761 |
| 4,527,119 | 7/1985 | Rogers et al. | 324/758 |

*Primary Examiner*—Josie Ballato
*Assistant Examiner*—Russell M. Kobert
*Attorney, Agent, or Firm*—Jacobson, Price, Holman & Stern, PLLC

[57] ABSTRACT

A printed circuit board (PCB) testing system for testing various types of PCBs includes a base plate corresponding to a target PCB; a plurality of probe assemblies, each having a probe pin electrically contactable with the target PCB and a removably securing member for removably attaching the probe pin on the base plate; a test point selection unit for determining a plurality of test points located on a target PCB to generate a test point selection signal representing the determined test points; and a probe arranging unit, in response to the test point selection signal, for moving and arranging said probes on positions of the base plate corresponding to said each determined test point to thereby bring each probe pin into contact with a corresponding test point.

14 Claims, 2 Drawing Sheets

ADAPTIVE PCB TESTING SYSTEM EMPLOYING REARRANGABLE TEST PROBES

BACKGROUND OF THE INVENTION

1. Field of the Invention

The present invention relates to a printed circuit board (PCB) testing system; and, more particularly, to an adaptive PCB testing system capable of compatibly testing various types of PCBs in an effective manner.

2. Discussion of the Related Art

Generally, in a conventional PCB testing system, a plurality of test probes having springs are fixedly mounted on positions of a base plate corresponding to each of testing points TP of a specific type of PCB. That means a customized PCB testing system, which has a fixed arrangement of test probes, can only be used to test a specific type of PCB and can not be used to test the other types of PCBs. In this respect, a private or customized PCB testing system suitable for each model of PCBs has been widely used.

However, such a PCB testing system has several problems. One of the problems is that the customized conventional PCB testing system has no compatibility with other systems. That is, since the PCB testing system must be newly manufactured whenever a model of the product or a type of PCB is changed, the cost is, therefore, increased and loss of time is caused in separately manufacturing a private PCB testing system. Particularly, in case of an in-line system capable of manufacturing various types of products, the product-line must partially be changed whenever the model or type of the PCB changes, thereby causing the limitation in implementing an automatic system.

SUMMARY OF THE INVENTION

Accordingly, the present invention is directed to a PCB testing system that substantially obviates one or more of the problems due to limitations and disadvantages of the related art.

An object of the present invention is to provide an adaptive PCB testing system in which the position of a probe can simply be changed to correspond to the PCB whenever a model of the PCB is changed so as to improve operation efficiency and provide compatibility of the system.

Another object of the present invention is to provide an adaptive PCB testing system which enables in-line automatic system, manufacture of various types of PCBs, and remote control test.

In accordance with a preferred embodiment of the present invention, there is provided a printed circuit board (PCB) testing system for testing various types of PCBs comprising: a base means corresponding to a target PCB; a plurality of probe assemblies, each having a probe pin electrically contactable with the target PCB and removable securing means for removably attaching the probe pin on the base means; test point selection means for determining a plurality of test points located on a target PCB to generate a test point selection signal representing the determined test points; and probe arranging means, in response to the test point selection signal, for moving and arranging said probes on positions of the base means corresponding to each determined test point to thereby bring each probe pin into contact with a corresponding test point.

In accordance with another preferred embodiment of the present invention, there is provided a printed circuit board (PCB) testing system for testing various types of PCBs comprising: base means corresponding to the PCB; and a plurality of probe assemblies removably secured on the base means, each probe assembly having a probe pin to be contacted with a testing point of the PCB, and removable securing means, attached to a lower portion of the probe pin, for removably securing or fixing the probe pin on a point of the base means.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Reference will now be made in detail to the preferred embodiments of the present invention, examples of which are illustrated in the accompanying drawings.

Figure 1:
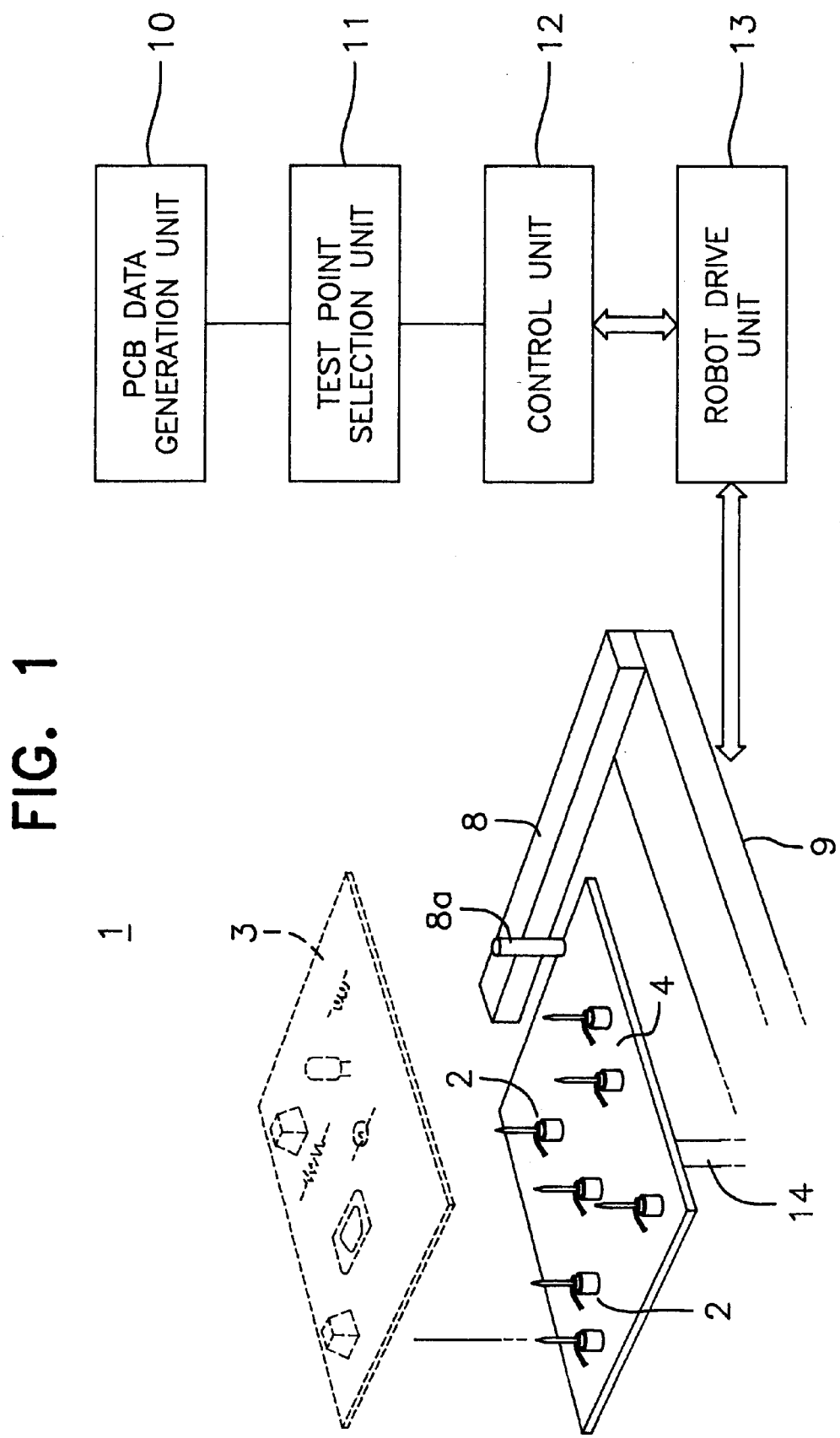
FIG. 1 is a schematic diagram illustrating a PCB testing system in accordance with the present invention.

Referring to FIG. 1, there is shown a printed circuit board (hereinafter referred as PCB) testing system in accordance with the present invention. The PCB testing system 1 includes a test equipment part and a control part. The test equipment part is provided with a base plate 4 and a plurality of probe assemblies 2, wherein the size and the shape of the base plate 4 corresponds to a target PCB 3 to be tested.

Each of the probe assemblies 2 is removably secured on the base plate 4 by using the control part. The control part directs the arrangement of each probe assembly to correspond to each of the previously assigned test points contained in the target PCB 3. As shown, the base plate 4 is selectively moved up and down in vertical direction so as to bring the probe assemblies into contact with the test points of the target PCB 3. When the probe assemblies are contacted with the test points of the target PCB 3, data, e.g., voltage information, current information or the like, is obtained through the use of the probe assemblies in contact with the test points of the target PCB 3 and the test for the target PCB 3 is performed by a test unit (not shown) employing the data obtained therefrom.

The control part includes a mechanical robot unit, a PCB data generation unit 10, a test point selection unit 11, a control unit 12 and a robot drive unit 13. The control part serves to rearrange the probe assemblies on the base plate 4 to accommodate the arrangement of the test points on the target PCB.

The PCB data generation unit 10 can be implemented by an electronic drawing system having, e.g., a scanner, drawing software or the like. The PCB data generation unit serves to generate PCB data representing the configuration of the target PCB.

The test point selection unit 11 can be implemented using a man-machine interface, e.g., a key pad, a mouse, a touch screen or the like. The test point selection unit is used to select test points contained in the target PCB based on the PCB data. Such test points may thereof be selected responsive to the user's actuation. In another embodiment of the present invention, the test points can be automatically determined based on the PCB data to generate a test point selection signal representing the determined test points.

The control unit 12 can be implemented using a microprocessor and serves to receive the test point selection signal and generate a control signal for use in the operation of the robot drive unit 13. In accordance with the preferred embodiment of the present invention, the control signal specifies X-Y coordinates, each X-Y coordinate representing a location on the base plate 4 corresponding to one of the test points, and is fed to the robot drive unit 13.

The robot drive unit 13 receives the control signal and actuates the mechanical robot unit to move and arrange the probe assemblies 2 based thereon to positions on the base plate 4 corresponding to each determined test point. The mechanical robot unit includes robot arms 8 and 9 and a robot hand 8a. In accordance with another embodiment of the present invention, the PCB data generation unit 10, a test point selection unit 11 and a control unit 12 can be implemented by a personal computer system employing software for handling the circuit drawings.

In the PCB testing system, when a PCB of a specific model to be tested is determined, the PCB data generated from the PCB data generation unit 10 is inputted to a testing program contained in the test unit and the test point selection unit 11. At the test point selection unit 11, testing points are selected to thereby generate the test point selection signal denoting such selections; the test point selection signal is then directed to the control unit 12. At the control unit 12, X-Y coordinates representing the locations on the base plate 4 corresponding to each test point are calculated to generate a control signal identifying such coordinates which is relayed to the robot drive unit 13. Under the control of the robot drive unit 13, the probe assemblies 2 are sequentially clamped by a robot hand 8a of robot arms 8 and 9, moved and unclamped at predetermined positions on the base plate 4 to thereby arrange and removably secure them at predetermined positions on the base plate thereof. Thereafter, the test process for the same type of PCBs is performed using a test program, contained in the test unit and the arranged probe assemblies 2. For the sake of convenience, details of the test program and the test unit, which is not mainly related to the present invention, are omitted.

When the type of the PCB to be tested changes, the above process can be repeated and the probe assemblies rearranged, based on the newly generated control signal, by using robot hand 8a. Once the probe assemblies have been rearranged, the test process for another type of PCB can be performed.

Figure 2:
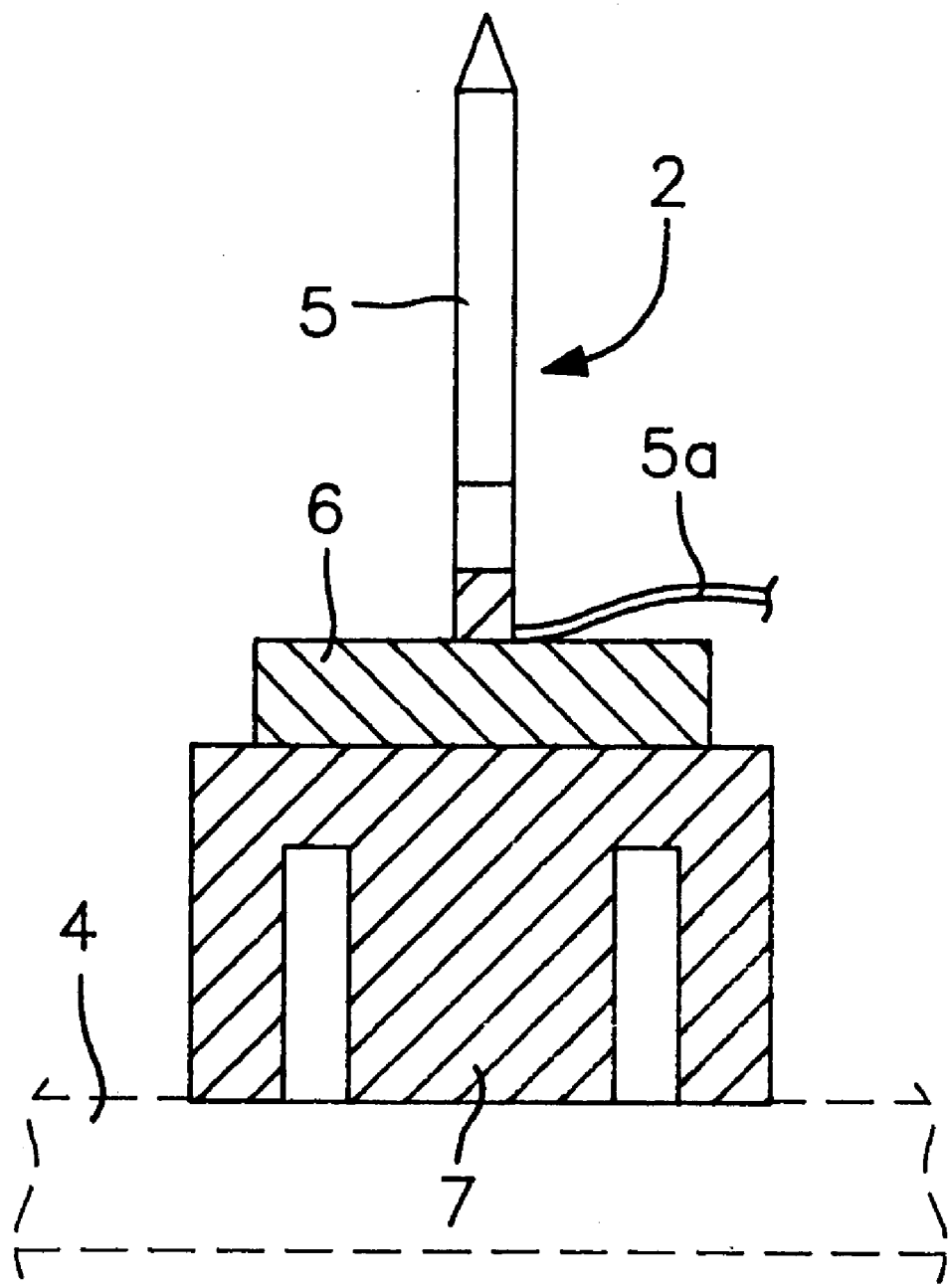
FIG. 2 is a partial sectional view illustrating a probe assembly shown in FIG. 1.

Referring to FIG. 2, there is demonstrated a partially sectional view depicting a rearrangable probe assembly 2 in accordance with the present invention. As shown, the probe assembly 2 includes a probe pin 5 electrically contactable with the test point of the target PCB, and a base member 7, removably attached to the base plate 4, for carrying the probe pin 5 fixed thereon. The probe pin can be also fixed on an insulator 6 secured on the base member 7 and the lower portion thereof provided with an electrical lead line 5a connected to the test unit.

In accordance with a preferred embodiment of the present invention, the base plate 4 is made of a metal plate and the base member 7 is made of a magnetic substance to thereby allow the probe assembly 2 to easily be attached to and separated from the base plate 4. On the other hand, the base member 7 can be made of an electromagnetic unit or a permanent magnetic substance.

In accordance with another embodiment of the present invention, the base plate is made of an electromagnetic unit or the permanent magnetic substance in order to obtain the removable attachment between the probe assembly 2 and the base plate 4 in an effective manner.

In accordance with another embodiment of the present invention, the base member is made of a suction cup (not shown) employing a vacuum effect. In this case, the base plate is preferably formed of a porous plate to allow the suction cup to be more stably located at a predetermined position on the base plate 4 by means of a vacuum absorber. Further, the insulator 6 for electrically insulating the probe pin 5 from the base member 7 can be removed therefrom and the probe pin 5 can be directly fixed on the base member 7.

Consequently, as may be seen from the above, it is readily appreciated that the robot hand 8a of the robot arms 8 and 9 can simply clamp the probe assembly 2 to move it to another position on the base plate so that the probe assemblies can be easily rearranged. In this way, the present invention can accommodate different testing points and thus different types of PCBs. Furthermore, after changing the positions of the probe assemblies 2, the probe assemblies 2 are reliably maintained in their positions by means of the magnetic force or the vacuum effect acting between the probe assemblies and the base plate, thereby allowing the testing operation to be flexibly and reliably performed.

As aforementioned with reference to FIGS. 1 and 2, it should be appreciated that, unlike the conventional PCB testing system which have a fixed arrangement corresponding to each model of the various PCBs, the positions of the probe assembly 2 in accordance with the present invention can simply be changed to be suitable for the selected PCB model by remote control through the computer.

Further, the PCB testing system of the present invention can be applied to all types of PCBs by using the removably securable probe assemblies and the apparatus for changing the positions of the probe assemblies. Furthermore, since one PCB testing system can test various types of PCBs, additional customized testing devices are not required, thereby reducing the manufacturing costs and improving the compatibility thereof in an effective manner.

It will be apparent to those skilled in the art that various modifications and variations can be made in the PCB testing system according to the present invention without departing from the spirit or scope of the invention. Thus, it is intended that the present invention covers the modifications and variations of the invention provided they come within the scope of the appended claims and their equivalents.

What is claimed is:

1. A printed circuit board (PCB) testing system for testing various types of PCBs comprising:

base means corresponding to a target PCB;

a plurality of probe assemblies, each probe assembly having a probe pin electrically contactable with the target PCB and removable securing means for removably attaching the probe assembly to the base means;

test point selection means for selecting a plurality of test points located on the target PCB and for generating a test point selection signal representing the selected plurality of test points; and probe arranging means, in response to the test point selection signal, for moving and arranging said probe assemblies to positions on the base means corresponding to each selected test point to thereby bring each probe pin into contact with a corresponding test point, said probe arranging means including, a control unit for generating a control signal based on the test point selection signal, the control signal specifying a plurality of X-Y coordinate pairs, each X-Y coordinate pair representing a position on the base means that corresponds to one of the selected plurality of test points; and a robot unit having two arms and a hand for moving, responsive to the robot drive unit, each probe assembly one at a time and in sequence, by clamping a respective probe assembly with the robot hand, moving the respective probe assembly to a test position on the base means that corresponds to one of the selected plurality of test points, and unclamping the respective probe assembly;

said removable securing means fixing the respective probe assembly to the base means at the test position for testing of the target PCB.

2. The PCB testing system as recited in claim 1, wherein the removable securing means is made of a magnetic substance and the base means is made of metal plate.

3. The PCB testing system as recited in claim 1, wherein the robot unit includes a robot drive unit for receiving the control signal and for directing, in accordance with the control signal, movement of the robot arms and hand.

4. The PCB testing system as recited in claim 3, wherein the test point selection means and control unit are implemented by using a personal computer system.

5. The PCB testing system as recited in claim 1, wherein the base means is made of a magnetic substance.

6. The PCB testing system as recited in claim 5, wherein the removable securing means comprises a metal body contactable with the base means and an insulator for fixing the probe pin in the metal body and for insulating the probe pin from the metal body.

7. The PCB testing system as recited in claim 1, wherein the removable securing means is a suction cup.

8. The PCB testing system as recited in claim 7, wherein the base means is formed of a porous plate.

9. An adaptive printed circuit board (PCB) testing system for testing various types of PCBs comprising:

base means corresponding to a target PCB; and a plurality of probe assemblies removably secured to the base means, each probe assembly having a probe pin to be contacted with a testing point on the PCB, and removable securing means, attached to a lower portion of the probe pin, for removably securing the probe assembly to a point on the base means;

a test point selection unit for selecting a plurality of test points located on the target PCB and for generating a test point selection signal representing the selected plurality of test points;

a control unit for generating, responsive to the test point selection signal, a control signal specifying a plurality of X-Y coordinate pairs, each X-Y coordinate pair representing a position on the base means that corresponds to one of the selected plurality of test points;

a robot drive unit for receiving the control signal; and a robot unit having two arms and a hand for moving, responsive to the robot drive unit, each probe assembly one at a time and in sequence, by clamping a respective probe assembly with the robot hand, moving the respective probe assembly to a test position on the base means that corresponds to one of the selected plurality of test points, and unclamping the respective probe assembly;

said removable securing means fixing the respective probe assembly to the base means at the test position for testing of the target PCB.

10. The PCB testing system as recited in claim 9, wherein the removable securing means is made of a magnetic substance and the base means is made of metal plate.

11. The PCB testing system as recited in claim 9, wherein the base means is made of a magnetic substance.

12. The PCB testing system as recited in claim 11, wherein the removable securing means comprises a metal body contactable with the base means and an insulator for fixing the probe pin in the metal body and for insulating the probe pin from the metal body.

13. The PCB testing system as recited in claim 9, wherein the removable securing means is a suction cup.

14. The PCB testing system as recited in claim 13, wherein the base means is formed of a porous plate.

* * * * *